(12) United States Patent
Suvarna et al.

(10) Patent No.: US 10,304,833 B1
(45) Date of Patent: May 28, 2019

(54) METHOD OF FORMING COMPLEMENTARY NANO-SHEET/WIRE TRANSISTOR DEVICES WITH SAME DEPTH CONTACTS

(71) Applicant: GLOBALFOUNDRIES Inc., Grand Cayman (KY)

(72) Inventors: Puneet Harischandra Suvarna, Menands, NY (US); Bipul C. Paul, Mechanicville, NY (US); Ruilong Xie, Niskayuna, NY (US); Bartlomiej Jan Pawlak, Leuven (BE); Lars W. Liebmann, Mechanicville, NY (US); Daniel Chanemougame, Niskayuna, NY (US); Nicholas V. LiCausi, Watervliet, NY (US); Andreas Knorr, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/898,812

(22) Filed: Feb. 19, 2018

(51) Int. Cl.
| | | |
|---|---|---|
| *H01L 29/775* | (2006.01) | |
| *H01L 29/78* | (2006.01) | |
| *H01L 27/092* | (2006.01) | |
| *H01L 21/02* | (2006.01) | |
| *H01L 21/8238* | (2006.01) | |
| *H01L 29/06* | (2006.01) | |
| *H01L 29/10* | (2006.01) | |

(Continued)

(52) U.S. Cl.
CPC .... *H01L 27/0924* (2013.01); *H01L 21/02603* (2013.01); *H01L 21/823807* (2013.01); *H01L 21/823821* (2013.01); *H01L 27/1211* (2013.01); *H01L 29/0653* (2013.01); *H01L 29/0673* (2013.01); *H01L 29/1037* (2013.01); *H01L 29/42392* (2013.01)

(58) Field of Classification Search
None
See application file for complete search history.

(56) References Cited

U.S. PATENT DOCUMENTS

2018/0047832 A1* 2/2018 Tapily ................. H01L 29/0673

OTHER PUBLICATIONS

U.S. Appl. No. 15/866,855, filed Jan. 10, 2018, entitled "Circuits Based on Complementary Field-Effect Transistors".

* cited by examiner

*Primary Examiner* — Steven H Loke
*Assistant Examiner* — Scott Stowe
(74) *Attorney, Agent, or Firm* — Amerson Law Firm, PLLC

(57) ABSTRACT

A device includes a first nano-sheet of a first semiconductor material. First source/drain regions are positioned adjacent ends of the first nano-sheet. A first dielectric material is positioned above the first source/drain regions. A second nano-sheet of a second semiconductor material is positioned above the first nano-sheet. Second source/drain regions are positioned adjacent ends of the second nano-sheet and above the first dielectric material. A gate structure has a first portion capacitively coupled to the first nano-sheet and a second portion capacitively coupled to the second nano-sheet. A first source/drain contact contacts a first portion of the second source/drain regions in a first region where the first and second source/drain regions do not vertically overlap. The first source/drain contact has a first depth that extends below a height of an upper surface of the first source/drain regions in a second region where the first and second source/drain regions vertically overlap.

20 Claims, 18 Drawing Sheets

(51) Int. Cl.
*H01L 29/423* (2006.01)
*H01L 27/12* (2006.01)

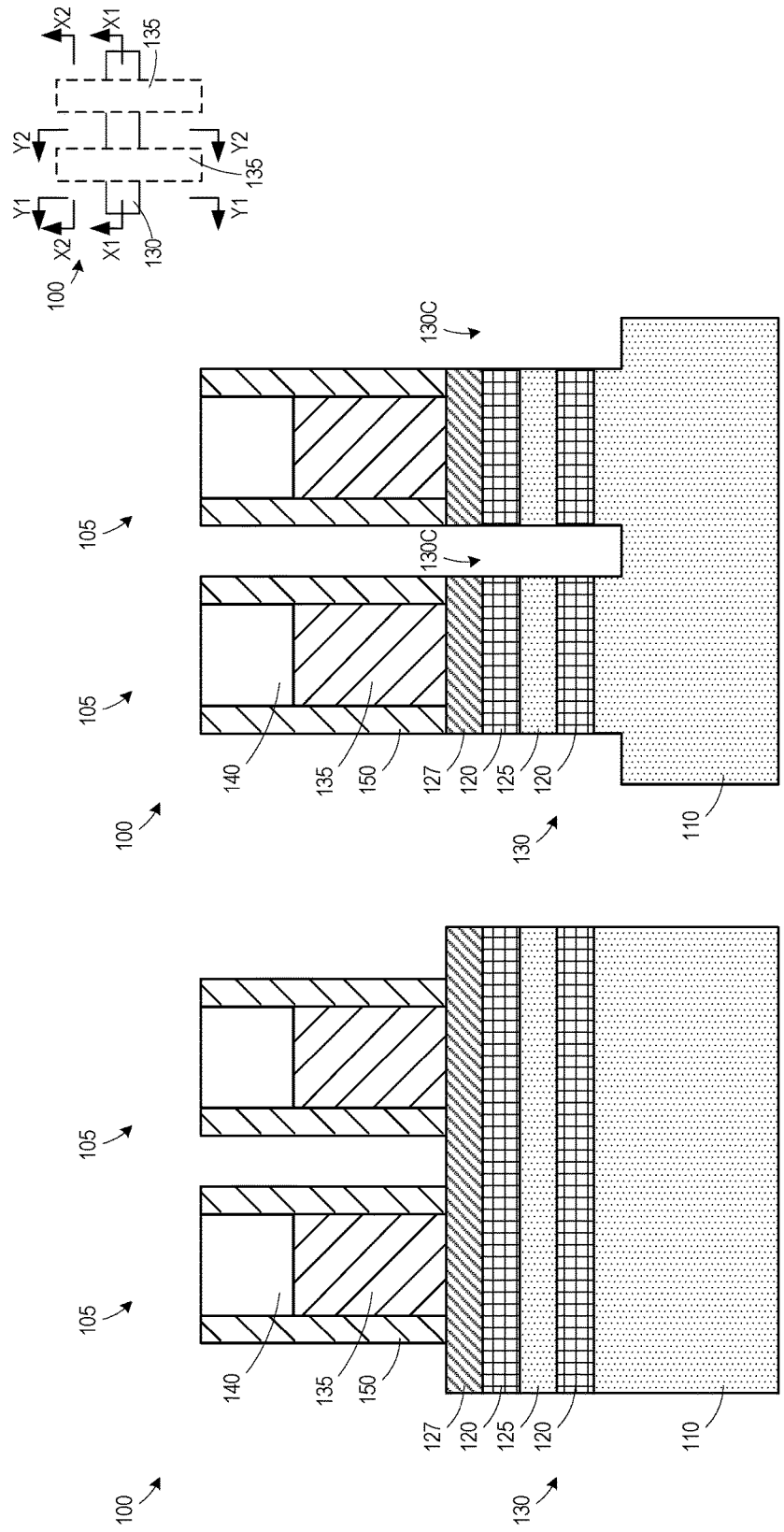

View X1-X1

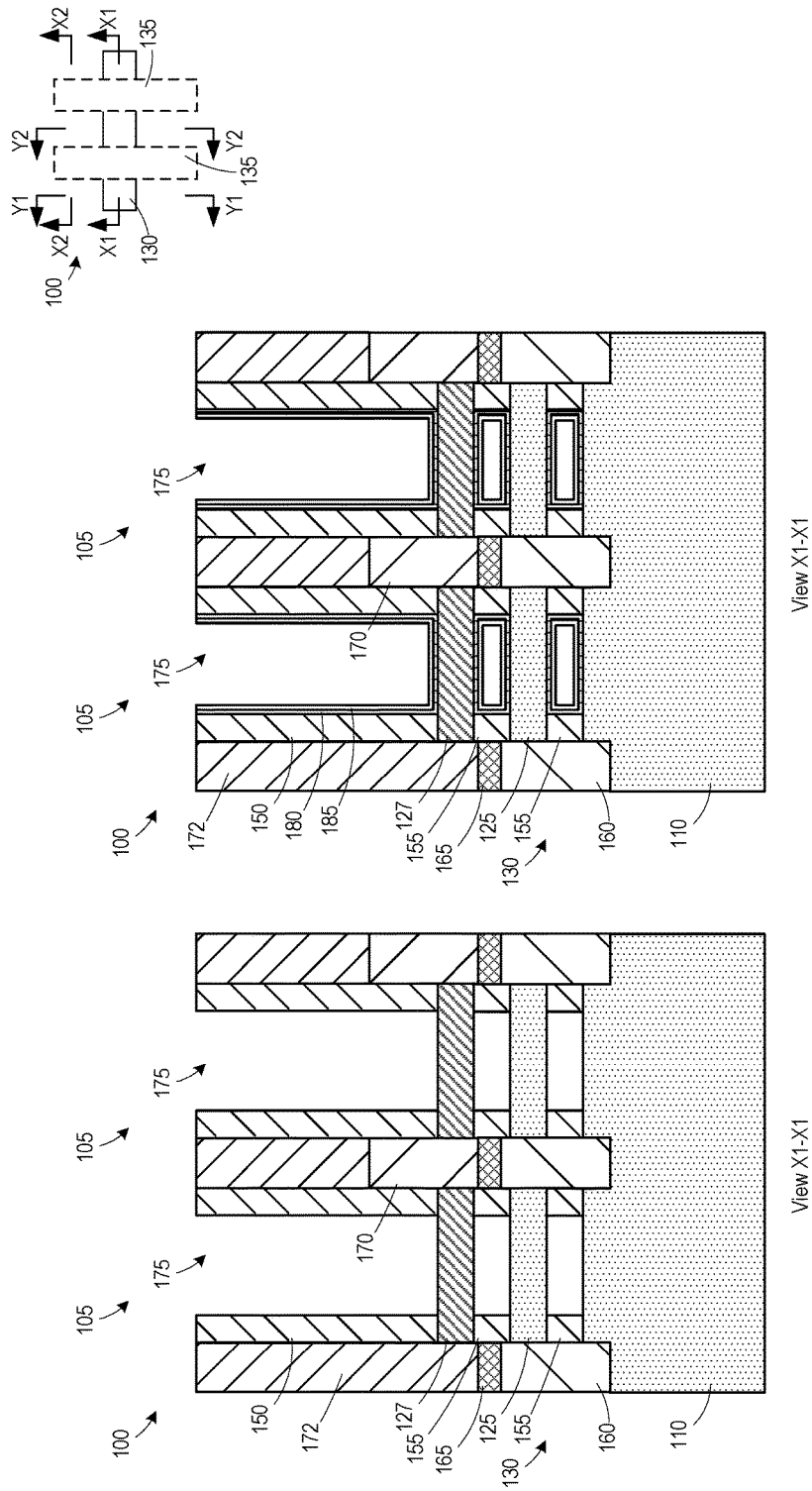

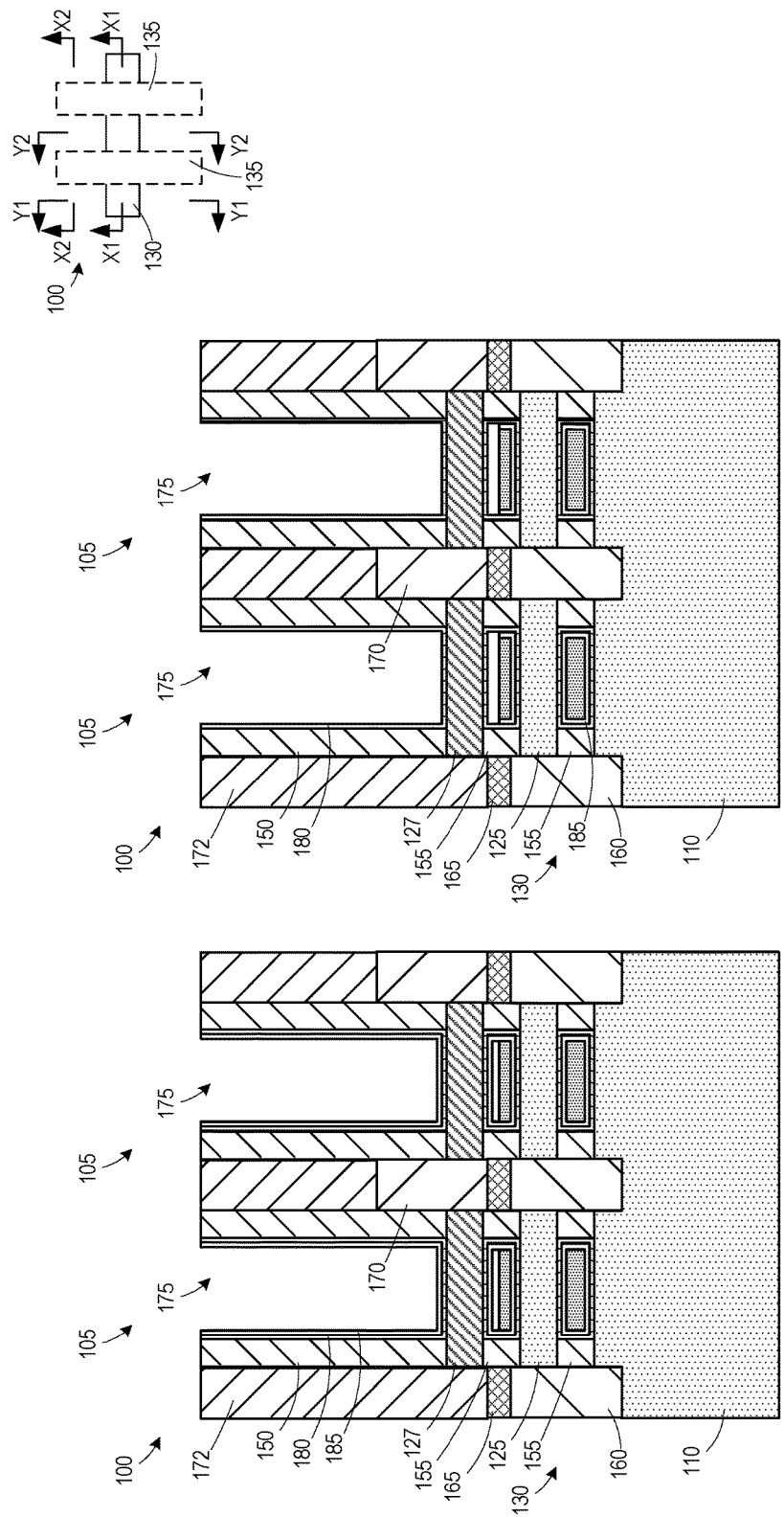

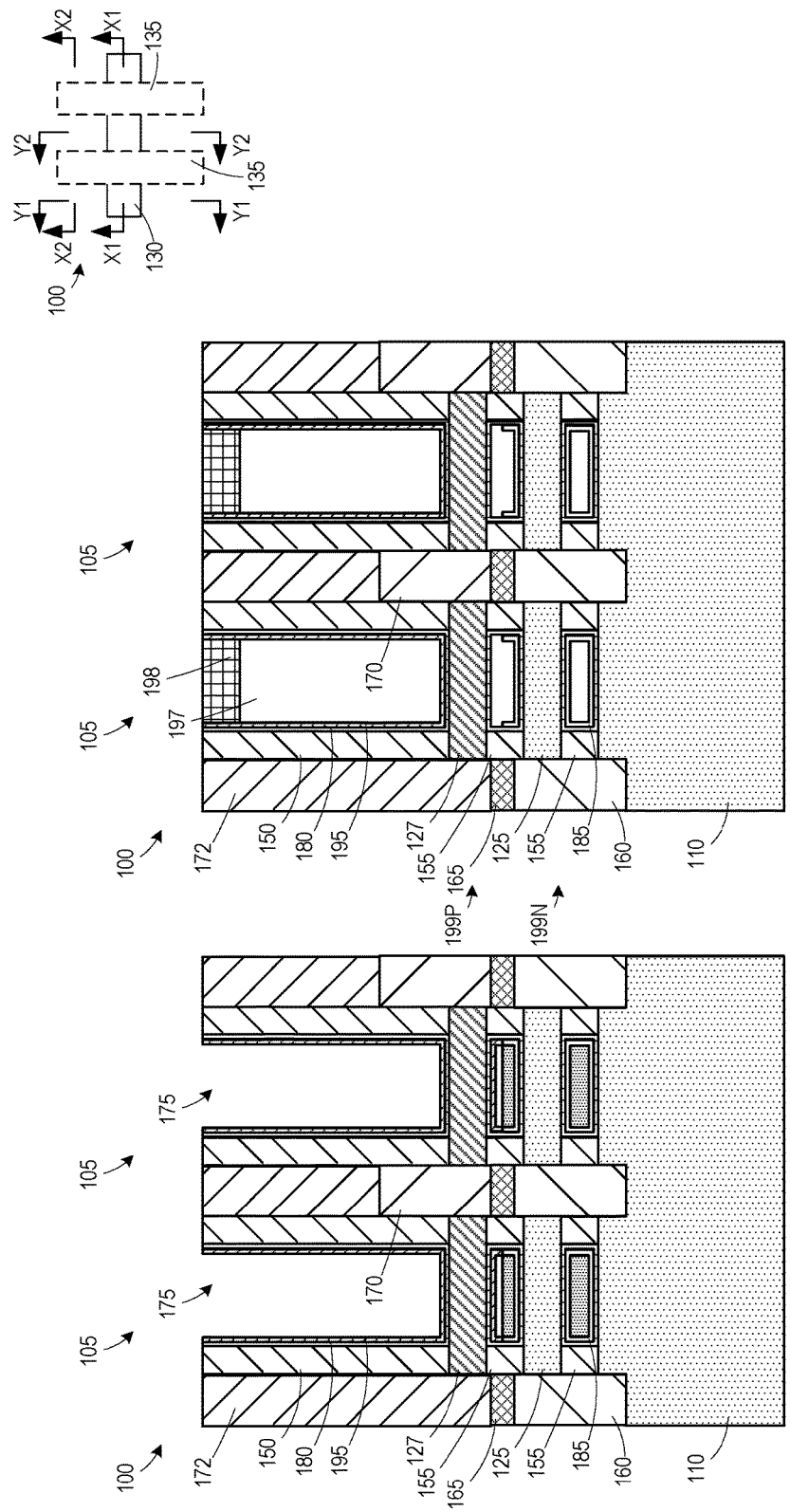

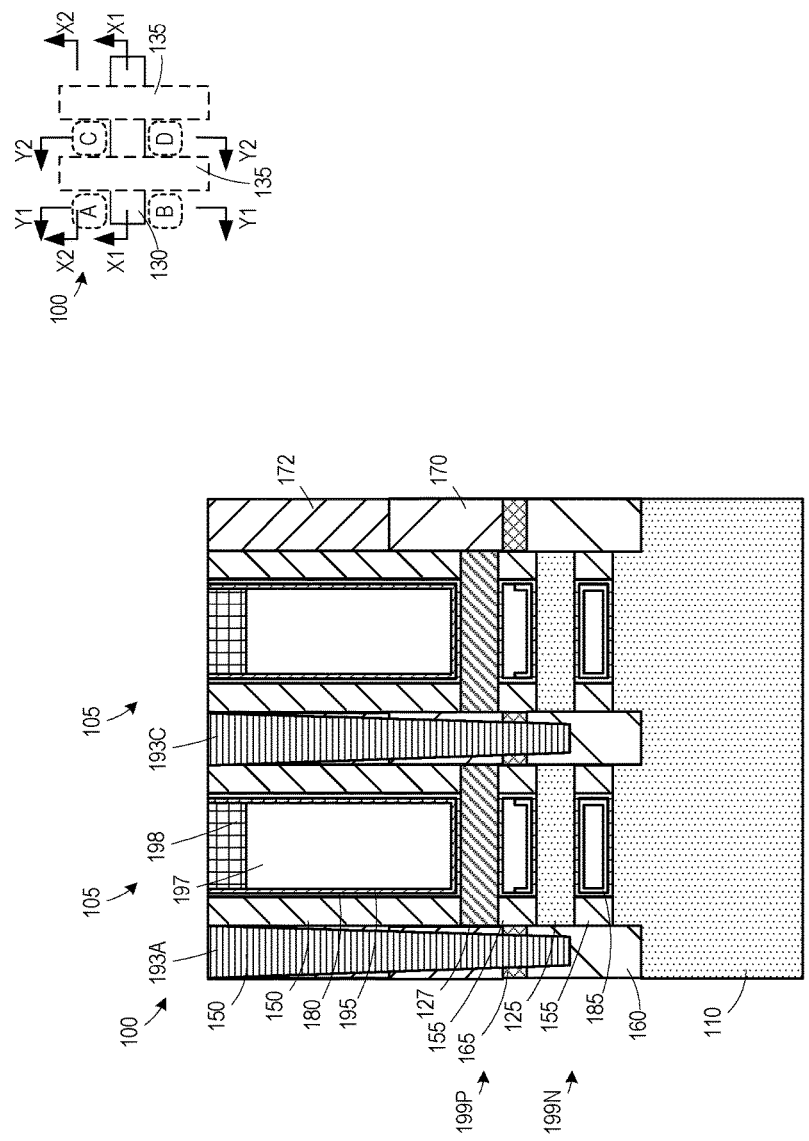

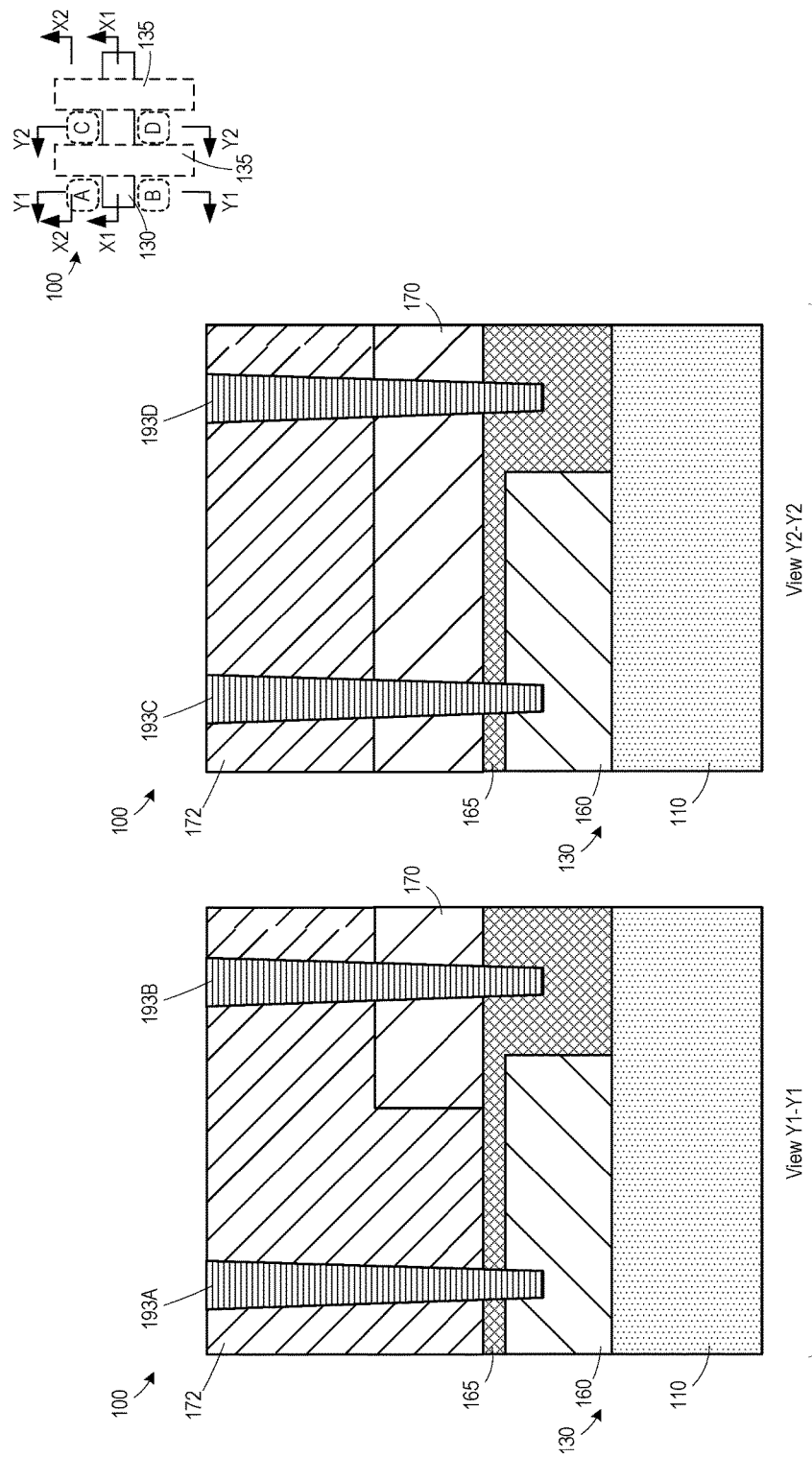
Figure 1O2

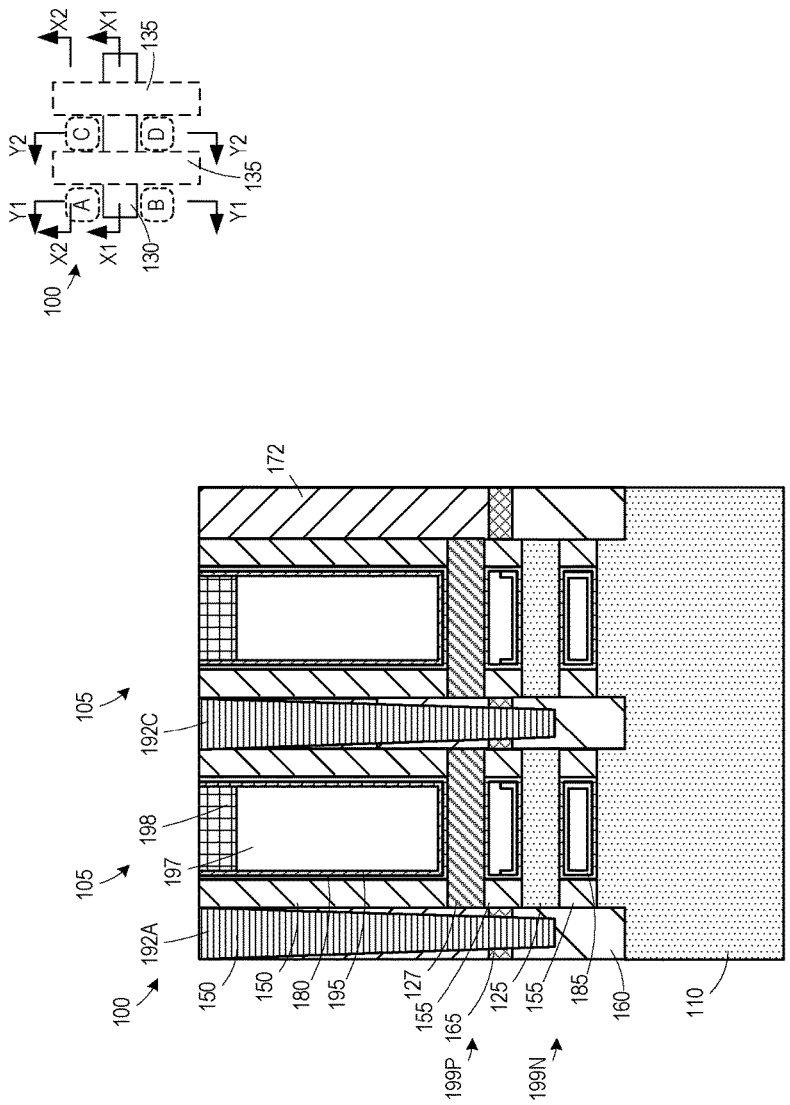
Figure 1P1

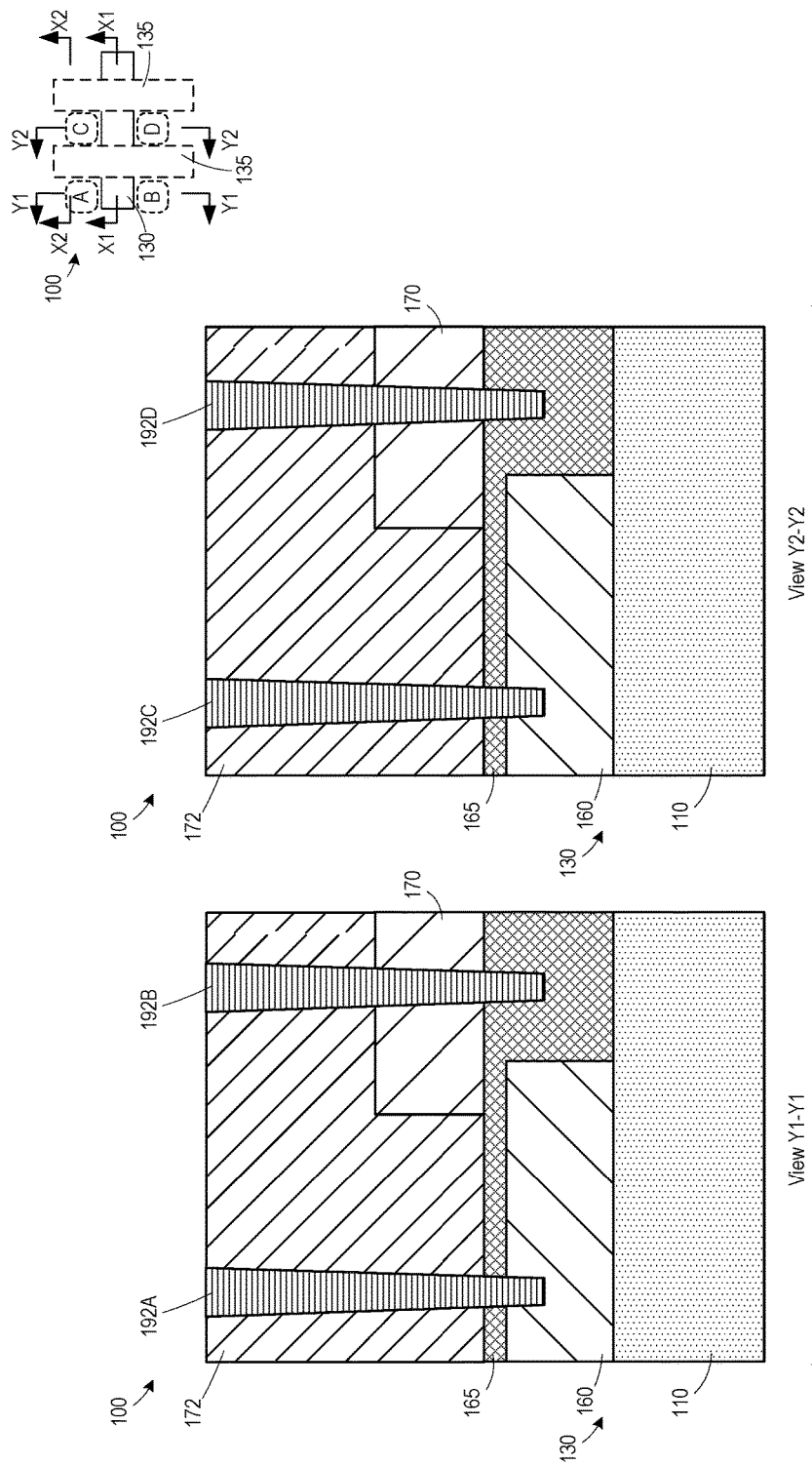
Figure 1P2

METHOD OF FORMING COMPLEMENTARY NANO-SHEET/WIRE TRANSISTOR DEVICES WITH SAME DEPTH CONTACTS

BACKGROUND OF THE INVENTION

1. Field of the Invention

Generally, the present disclosure relates to the manufacture of semiconductor devices, and, more specifically, to various novel methods of forming complementary nano-sheet/wire transistor devices with same depth contacts and the resulting structures.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device includes drain and source regions and a gate electrode structure positioned above and between the source/drain regions. Upon application of an appropriate control voltage to the gate electrode, a conductive channel region forms between the drain region and the source region. A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure.

CMOS devices generally require both NMOS and PMOS devices. These devices are typically arranged in a pattern that allows the devices to be interconnected to create functional units. For example, a static random access memory (SRAM) cell typically includes two PMOS devices and four NMOS devices with different interconnects between the gates and source/drain regions to create the memory cell. The various devices consume area in the circuit layout, resulting in a minimum cell area. Generally reducing the cell area requires an advancement in the process used that allows smaller devices to be fabricated. It would be useful to reduce cell area without requiring a fundamental change in the fabrication processes.

The present disclosure is directed to various novel methods of forming complementary nano-sheet/wire transistor devices with same depth contacts and the resulting structures that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel complementary nano-sheet transistor devices with same depth contacts. One illustrative device disclosed herein includes, among other things, a first nano-sheet of a first semiconductor material. First source/drain regions are positioned adjacent ends of the first nano-sheet. A first dielectric material is positioned above the first source/drain regions. A second nano-sheet of a second semiconductor material is positioned above the first nano-sheet. Second source/drain regions are positioned adjacent ends of the second nano-sheet and above the first dielectric material. A gate structure has a first portion capacitively coupled to the first nano-sheet and a second portion capacitively coupled to the second nano-sheet. A first source/drain contact contacts a first portion of the second source/drain regions in a first region where the second source/drain regions do not vertically overlap the first source/drain regions. The first source/drain contact has a first depth that extends below a height of an upper surface of the first source/drain regions in a second region where the second source/drain regions vertically overlap the first source/drain regions.

An illustrative method disclosed herein includes, among other things, forming a stack of semiconductor material layers above a substrate. The stack includes at least a first nano-sheet of a first semiconductor material and a second nano-sheet of a second semiconductor material. First source/drain regions are formed adjacent ends of the first nano-sheet. A first portion of the first source/drain regions is removed in a first contact region. A first dielectric material is formed above the first source/drain regions and above the first contact region. Second source/drain regions are formed adjacent ends of the second nano-sheet and above the first dielectric material. A gate structure having a first portion capacitively coupled to the first nano-sheet and a second portion capacitively coupled to the second nano-sheet is formed. A first source/drain contact contacting a second portion of the second source/drain regions in the first contact region is formed. The first source/drain contact has a first depth that extends below an upper surface of the first source/drain regions in a second contact region where the second source/drain regions vertically overlap the first source/drain regions.

BRIEF DESCRIPTION OF THE DRAWINGS

The disclosure may be understood by reference to the following description taken in conjunction with the accompanying drawings, in which like reference numerals identify like elements, and in which:

FIG. 2 depicts an alternative process flow for forming complementary nano-sheet transistor devices;

Figure 1C:
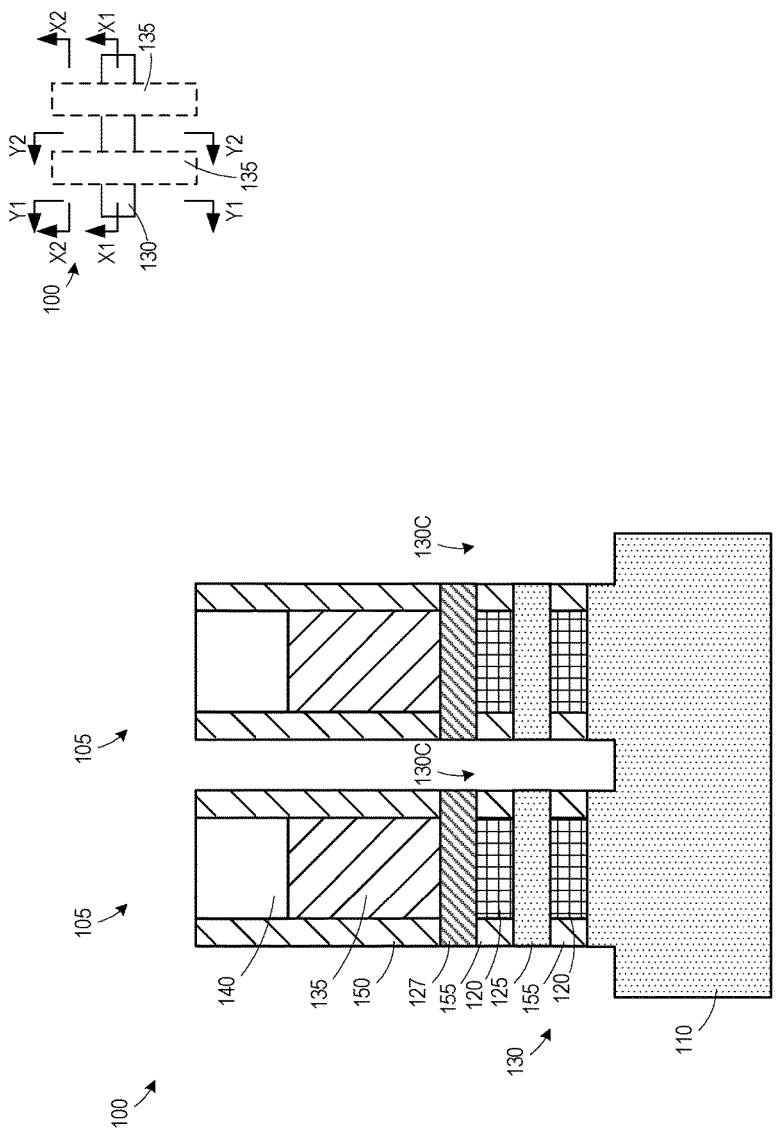
FIGS. 1A-1P2 depict various illustrative novel methods disclosed herein for forming complementary nano-sheet transistor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2:
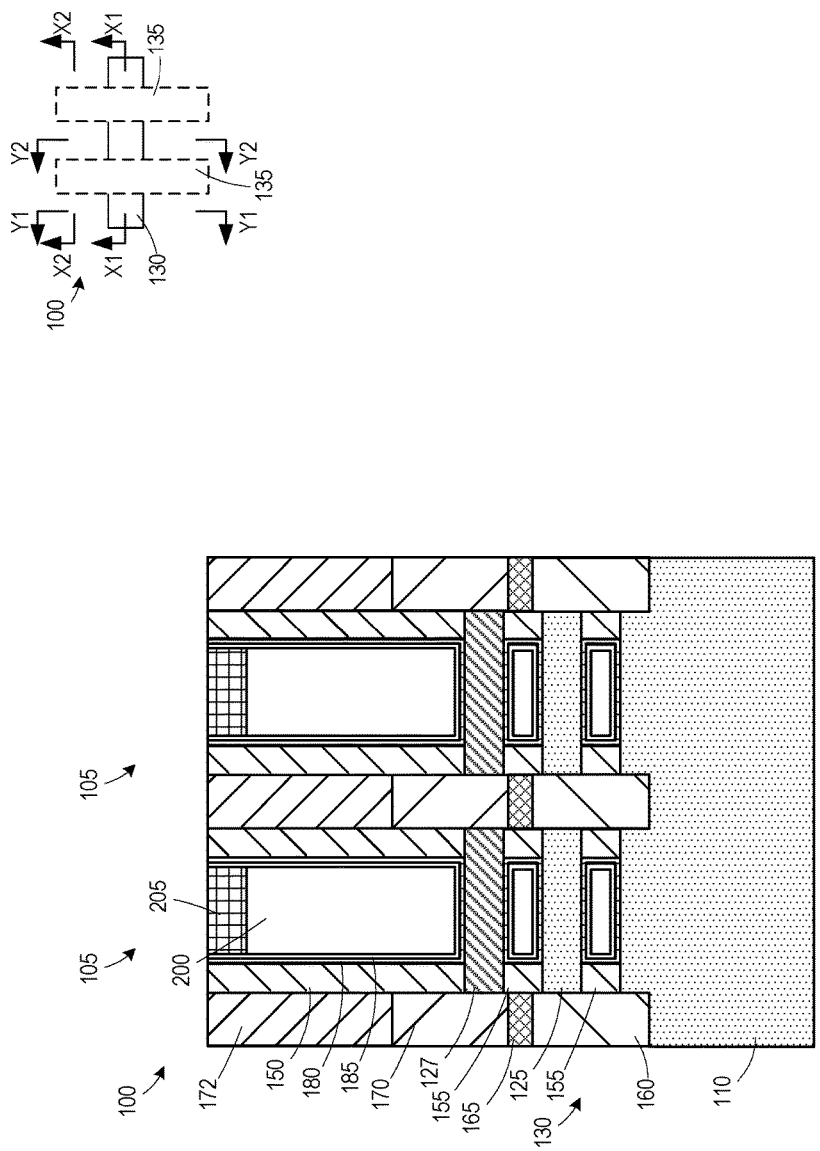

FIGS. 1A-1P2 depict various illustrative novel methods disclosed herein for forming complementary nano-sheet transistor devices on an IC product 100 including a nano-sheet device 105. In the examples depicted herein, the integrated circuit product 100 will be formed in and above a semiconductor substrate 110. A plurality of semiconductor material layers 120, 125, 127 was formed above the substrate 110, which may have a variety of configurations, such as the depicted bulk configuration. Alternatively, a semiconductor-on-insulator (SOI) configuration may be employed that includes a bulk semiconductor layer, a buried insulation layer positioned on the bulk substrate, and one or more semiconductor material layers positioned on the buried insulation layer. The substrate 110 may be made of silicon or it may be made of materials other than silicon, e.g., silicon-germanium, a III-V compound semiconductor material, etc. Thus, the terms "substrate" or "semiconductor substrate" should be understood to cover all semiconducting materials and all forms of such materials.

In the example depicted herein, the IC product 100 includes illustrative nano-sheet transistor devices 105. The illustrative device 100 depicted herein will be formed with one or more stacks 130 and gate structures 135 (depicted in dashed lines in the plan view) formed across the stacks 130. In some embodiments, the stacks 130 may be fin-like structures (i.e., a stack of nano-sheets having a narrow width compared to its axial length). Each stack 130 includes the plurality of alternating semiconductor material layers 120, 125, 127. The drawings contain a simplistic plan view of the product 100 and the nano-sheet devices 105 indicating where various cross-sectional views are taken. "X1-X1" and "X2-X2" views are taken in the gate length direction of the device 105 (perpendicular to the gate structure 135), and "Y1-Y1" and "Y2-Y2" views are taken in a gate width direction of the device 105 (along an axial length of the gate structure 135). However, no attempt will be made to show the various steps depicted in the cross-sectional views in the drawings in the plan view of the product 100.

FIG. 1A depicts the product 100 at a point in fabrication wherein several process operations have been performed. First, alternating semiconductor material layers 120, 125, 127 were formed above the substrate 110. Thereafter, a masking layer (not shown) was formed above the uppermost semiconductor material layer 127. An etching process was performed to define the stacks 130. In general, the semiconductor material layers 120, 125, 127 may be made of different semiconductor materials, and they are made of materials that may be selectively removed (by etching) relative to one another. In one example depicted herein, the semiconductor material layers 120 are sacrificial in nature while the semiconductor material layers 125, 127 will become the channel region material for the nano-sheet devices 105. The semiconductor material layer 125 may be a P-type channel layer and the semiconductor channel layer 127 may be an N-type channel layer. In one illustrative embodiment described below that employs work function material techniques to provide matched threshold voltages, the semiconductor material 120 may include silicon-germanium ($Si_xGe_{(1-x)}$ where x ranges from 0.0 to 1.0) and the semiconductor material layers 125, 127 may include substantially pure silicon. In another illustrative embodiment described below that employs channel material techniques to provide matched threshold voltages, the semiconductor material 120 may include silicon-germanium ($Si_xGe_{(1-x)}$ where x ranges from 0.0 to 1.0), the semiconductor material layers 125 may include substantially pure silicon, and the semiconductor material layers 127 may include silicon-germanium ($Si_yGe_{(1-y)}$ where y is sufficiently different than x (e.g., x<y) to provide etch selectivity. The thicknesses of the semiconductor material layers 120, 125, 127 may vary depending upon the particular application and they need not have the same thicknesses, although they may in some applications. In one illustrative embodiment, the semiconductor material layers 120 may have a thickness of about 8-15 nm, while the semiconductor material layers 125, 127 (i.e., the channel materials) may have a thickness of about 6-10 nm. The number of semiconductor material layers 120, 125, 127 that are formed may also vary depending upon the particular application. In the illustrative example depicted herein, one channel layer 125, 127 is provided for each device type. In other embodiments, multiple layer of channel material may be provided for each device type.

The semiconductor material layers 120, 125, 127 may be formed using a variety of techniques. In one illustrative example, where the substrate 110 is an SOI substrate, the substrate may be obtained from the substrate supplier with an active layer including the first semiconductor material layer 120. Alternatively, the active layer of the SOI substrate may be silicon as originally supplied by the substrate supplier. The active silicon layer may be converted to a layer of silicon germanium by epitaxially depositing a germanium-containing material (e.g., SiGe) or germanium on the silicon active layer, and thereafter performing an anneal process to cause the germanium in the germanium or silicon germanium layer to diffuse into the silicon active layer. In yet another example, the substrate 110 may be a simple bulk silicon substrate. In that case, the first semiconductor material layer 120, e.g., silicon germanium, may be epitaxially deposited on the upper surface of the bulk silicon substrate. Irrespective of how the first semiconductor material layer 120 is formed, the subsequent semiconductor material layers 120, 125, 127 may be sequentially deposited on the substrate 110 by performing multiple epitaxial deposition processes. The semiconductor material layers 120, 125, and 127 may subsequently be patterned to form the stacks 130.

After forming the stacks 130, the gate structures 135 were formed thereabove, contacting top and sidewall surfaces of the stacks 130. In the illustrated embodiment, the gate structures 135 are sacrificial in nature in that they are replaced at a later point in the process flow with other materials to form functional gate structures, as described below. The gate structures 135 may include one or more layers of material, such as a sacrificial gate insulation layer (e.g., silicon dioxide), and a sacrificial gate material (e.g., amorphous silicon)—not separately shown. A cap layers 140 (e.g., silicon nitride) formed from patterned hard mask layers employed to pattern the gate structures 135 is positioned above the gate structures 135. A sidewall spacer 150 (e.g., silicon nitride) is formed on sidewalls of the gate structures 135. In one embodiment, the sidewall spacer 150 may be formed by depositing a conformal layer of spacer material and performing an anisotropic etch process on the layer of spacer material.

FIG. 1B depicts the product 100 after one or more etch processes were performed to recess portions of the stacks 130 to define cavities 130C exposing end portions of the semiconductor material layers 120, 125, 127. The etch process is self-aligned with respect to the sidewall spacer 150. In one embodiment, the etch process may be an anisotropic etch.

FIG. 1C depicts the product 100 after a plurality of processes was performed to form end spacers 155 adjacent the semiconductor material layers 120. An isotropic etch process was performed to recess the semiconductor material layers 120 to define end recesses on ends of the semiconductor material layers 120. A conformal deposition process, such as an ALD process, was performed to form a layer of insulating material (e.g., silicon nitride) above the product 100. An etch process was performed to remove portions of the layer of insulating material not positioned in the end recesses.

Figure 1D:
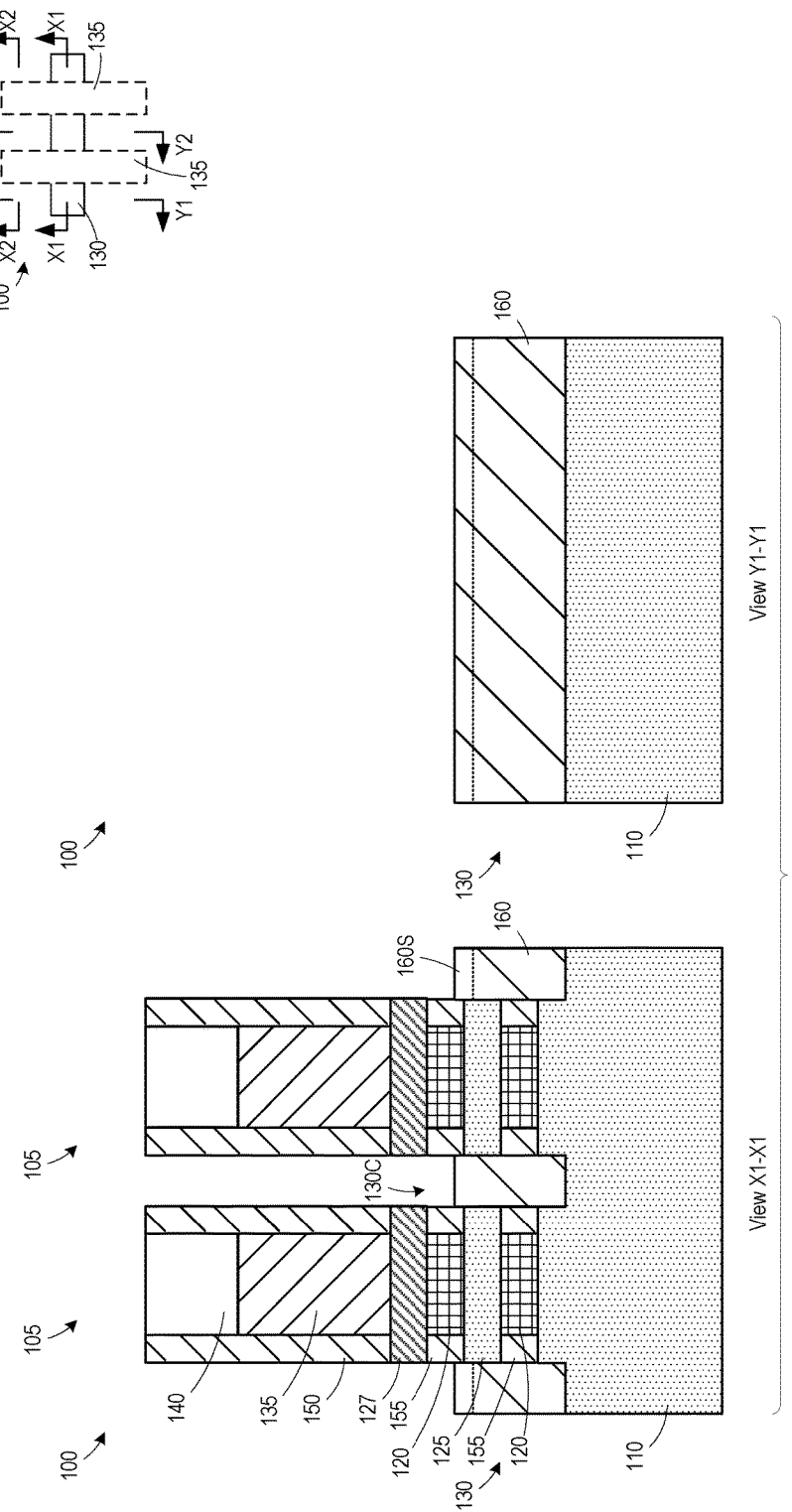

FIG. 1D illustrates the product 100 after an epitaxial deposition process was performed to define N-type source/drain material 160 in the cavities 130C. The N-type source/drain material 160 may be doped in situ during the growth process, or an implantation processes may be completed at a later time to dope the N-type source/drain material 160. The N-type source/drain material 160 may be formed such that is fills a substantial portion of the cavities 130C and etched back to reduce the height to a level below the semiconductor material layer 127. In some embodiments, an optional silicide layer 155S may be formed on the surface of the N-type source/drain material 160. The "Y1-Y1" view illustrates the N-type source/drain material 160 in the source/drain contact region between the gate structures 135.

Figure 1E:
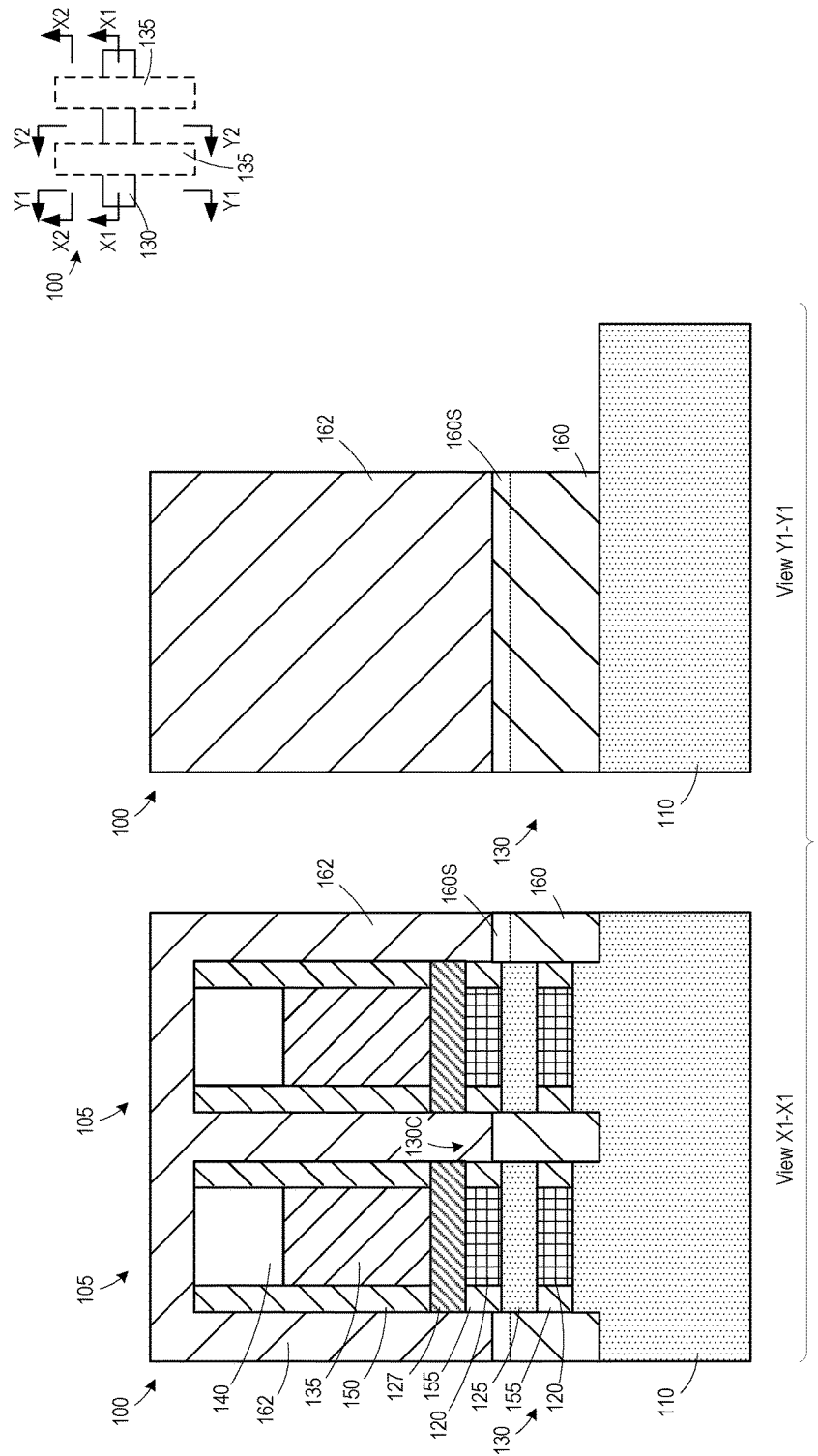

FIG. 1E illustrates the product 100 after several processes were performed. A patterned mask layer 162 (e.g., organic patterning layer (OPL)) was formed above the N-type source/drain material 160. An etch process was performed to remove exposed portions of the N-type source/drain material 160.

Figure 1F:
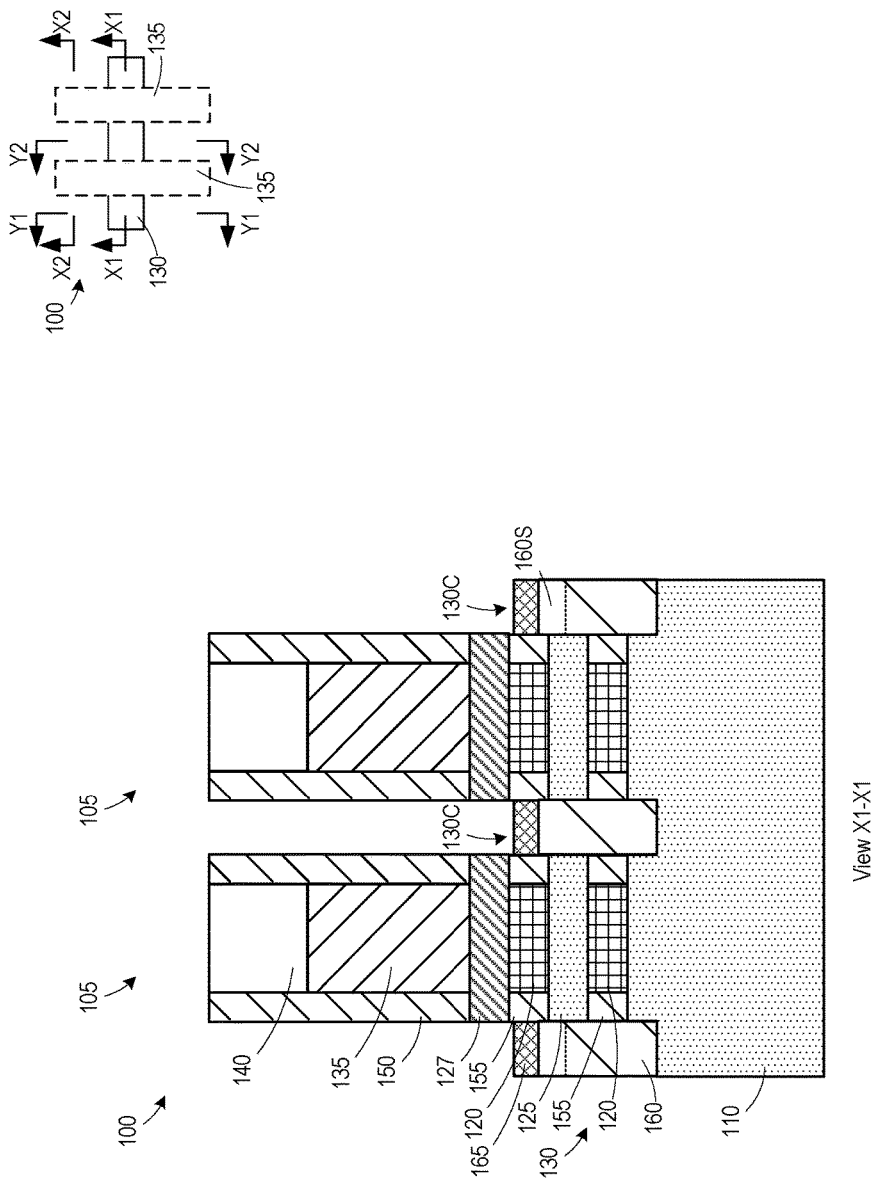

FIG. 1F illustrates the product 100 after the patterned mask layer 162 was removed and a process was performed to form a dielectric layer 165 (e.g., deposited oxide, deposited nitride, thermal oxide formed from portion of the N-type source/drain material, etc.) in the cavities 130C.

Figure 1G:
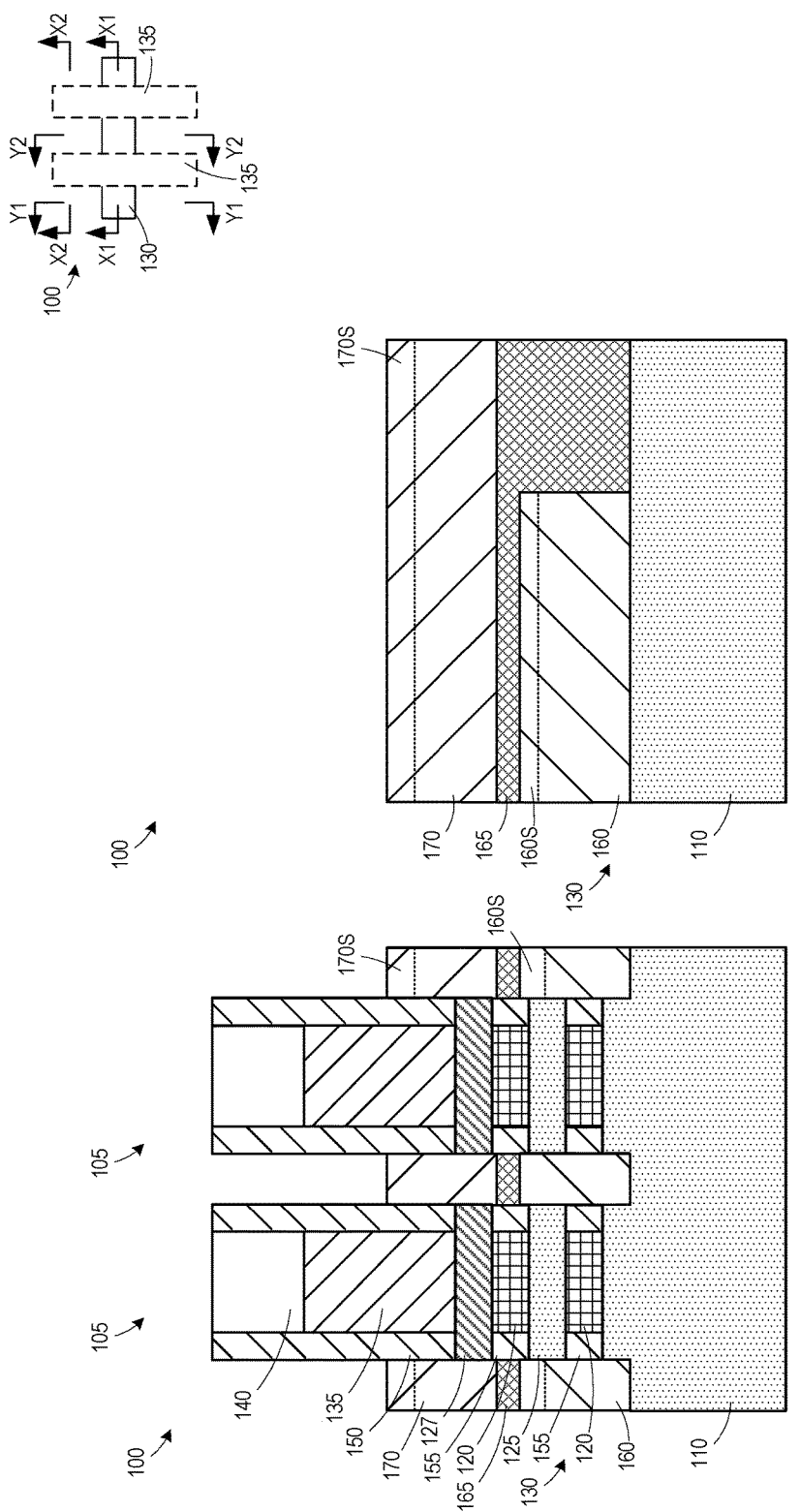

FIG. 1G illustrates the product 100 after an epitaxial deposition process was performed to define P-type source/drain material 170 in the cavities 130C. The P-type source/drain material 170 may be doped in situ during the growth process, or an implantation processes may be completed at a later time to dope the P-type source/drain material 170. The doped P-type source/drain material 170 may be formed such that is fills a substantial portion of the cavities 130C, and then the doped P-type source/drain material 170 may be etched back to a reduced height. In some embodiments, an optional silicide layer 170S may be formed on the surface of the P-type source/drain material 170. For ease of illustration the optional silicide layers 160S, 170S are omitted after FIG. 1G.

Figure 1H:
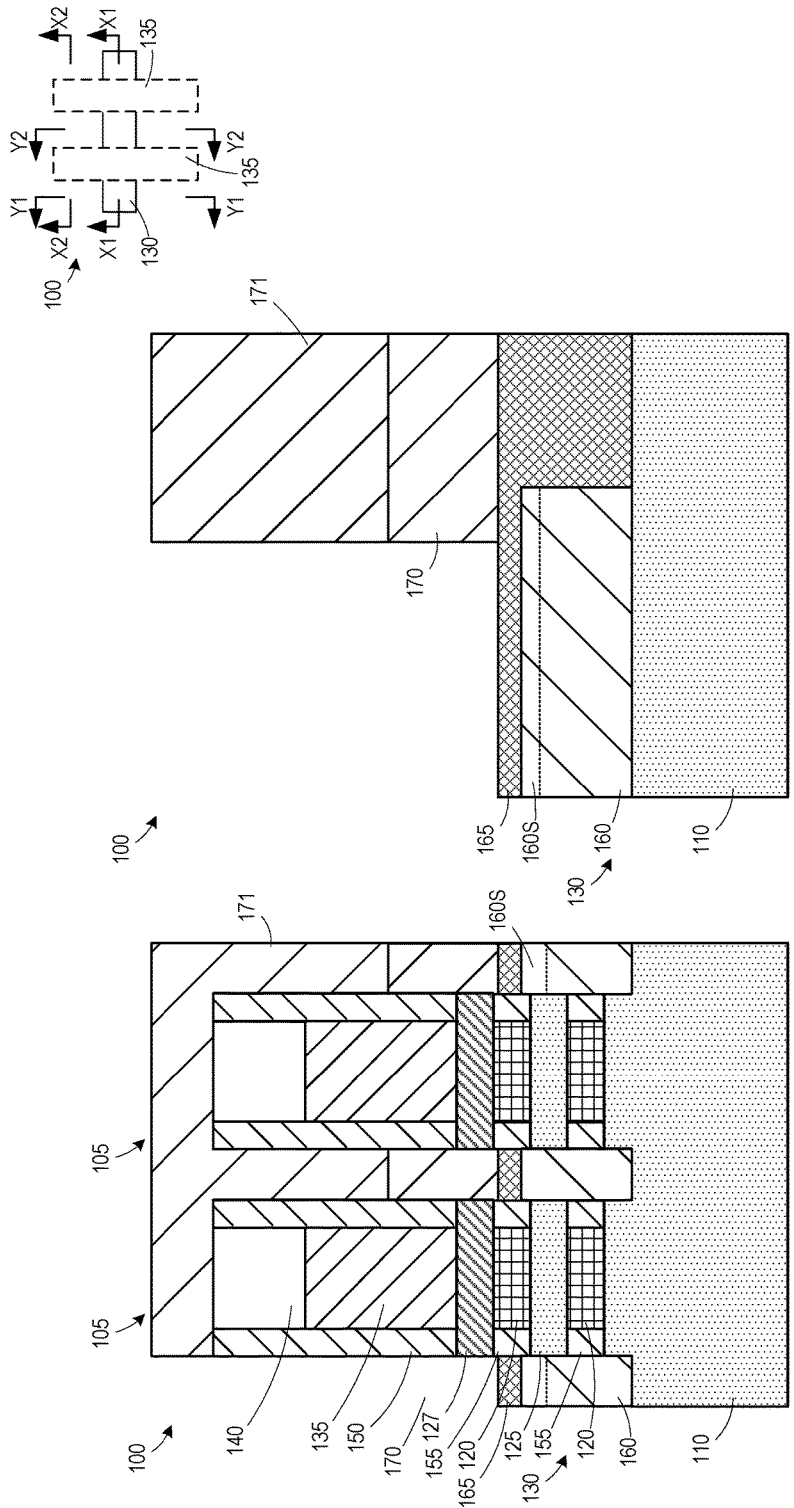

FIG. 1H illustrates the product 100 after several processes were performed. A patterned mask layer 171 (e.g., organic patterning layer (OPL)) was formed above the P-type source/drain material 170. An etch process was performed to remove exposed portions of the P-type source/drain material 170.

FIG. 1I illustrates the product 100 after several processes were performed. An etch process was performed to remove the patterned mask layer 171. A plurality of processes (e.g., deposition, planarization) were performed to form a dielectric layer 172 (e.g., silicon dioxide, low-k dielectric layer, ultra-low-k dielectric layer, etc.) between the gate structures 135 and their associated spacers 150. A plurality of etch processes was then performed to selectively remove the cap layer 140, the gate structures 135 (i.e., the sacrificial gate material and underlying sacrificial gate insulation layer), and the semiconductor material layers 120 to define replacement gate cavities 175. This process operation results in the formation of vertically spaced-apart semiconductor material layers 125, 127 within the gate cavities 175 for the nano-sheet devices 105 with open spaces disposed therebetween in what will become the channel regions for the nano-sheet devices 105. It should be noted that, at this point in time, portions of the spaced-apart semiconductor material layers 125, 127 extend into and out of the plane of the drawing page. Additionally, portions of the semiconductor material layers 120 may remain positioned between the semiconductor material layers 125, 127 in the regions outside of the gate cavities 175 that were not replaced by the source/drain regions. Thus, the spaced-apart semiconductor material layers 125, 127 on the nano-sheet devices 105 within the gate cavity 175 are fully supported after the portions of the semiconductor material layers 120 within the gate cavities 175 of the nano-sheet devices 105 have been removed.

FIG. 1J illustrates the product 100 after a plurality of deposition processes was performed to define a gate insulation layer 180 (e.g., silicon dioxide, a high-k insulation material (e.g., k greater than 10), etc.) and an N-type work function material (nWFM) layer 185 (e.g., a stack of TiN/AiAlC/TiN—not separately shown).

FIG. 1K illustrates the product 100 after several processes were performed to form a filler layer 190 (e.g., a dielectric layer selectively etchable relative to the other materials of the devices 105) in the N-type portion of the gate cavities 175 (i.e., covering region with the semiconductor material layer 125). A deposition process was performed to overfill the gate cavities 175, a planarization process was performed to remove portions extending outside the gate cavities 175, and a recess etch process was performed to recess the filler layer 190 to expose the P-type portion of the gate cavities 175 including the semiconductor material layer 127.

FIG. 1L illustrates the product 100 one or more etch processes were performed to selectively remove the exposed portions of the nWFM layer 185.

FIG. 1M illustrates the product 100 after a deposition process was performed to form a P-type work function material (pWFM) layer 195 (e.g., TiN in the gate cavities 175.

FIG. 1N illustrates the product 100 after a plurality of processes was performed to define final or replacement gate electrodes 197 (e.g. metal) in the gate cavities 175. The simplistically depicted gate electrodes 197 were formed in the gate cavities 175 by depositing the gate electrode material, performing a planarization process to remove excess gate electrode material positioned outside of the gate cavities 175, recessing the gate electrode material, and forming a gate cap layer 198 above the recessed gate materials. Note that the nano-sheet devices 105 shown in FIG. 1L are gate-all-around (GAA) devices in that the spaces between the spaced-apart channel semiconductor material layers 125, 127 are filled with the material of the gate electrodes 197. The devices 105 include an N-type device 199N and a P-type device 199P with a shared gate electrode 197. In FIG. 1K, the threshold voltages of the complementary devices 198N, 198P are made consistent with one another using the different work function material layers 185, 195. The semiconductor material layers 125, 127 may thus be the same material (e.g., pure silicon).

FIGS. 1O1 and 1O2 illustrate the product 100 after several processes were performed to define source/drain contacts 193A, 193B, and 193C. A patterned etch process was performed to define contact openings in the dielectric layer 172. One or more deposition processes were performed to deposit conductive material to define the source/drain contacts 193A, 193B, and 193C. The source/drain contacts 193A, 193B, and 193C are intended to be schematic and representative in nature, as they may be formed using any of a variety of different conductive materials and by performing traditional manufacturing operations. The source/drain contacts 193A, 193B, and 193C may contain one or more barrier layers (not depicted). In one illustrative example, the source/drain contacts 193A, 193B, and 193C may be formed by depositing a conformal liner (e.g., Ti, TiN) followed by overfilling the cavities with a conductive fill material, such as tungsten, cobalt or copper. Thereafter, one or more CMP processes may be performed to remove excess portions of the materials of the source/drain contacts 193A, 193B, and 193C positioned outside of the cavities.

The source/drain contact 193A contacts the N-type source/drain material 160 in a non-overlap region, the source/drain contact 193B contacts the P-type source/drain material 170 in a non-overlap region, the source/drain contact 193C contacts the N-type source/drain material 160 and the P-type source/drain material 170 in an overlap region, and the source/drain contact 193D contacts the P-type source/drain material 170 in a non-overlap region. In some embodiments, not all of the contacts 193A-193D may be present. Due to the selective removal of portions of the N-type source/drain material 160 (i.e., in the region where the source/drain contact 193B is formed) and the P-type source/drain material 170 (i.e., in the region where the source/drain contact 193A is formed), the same etch process may be used to form all of the contact openings for the source/drain contacts 193A, 193B, and 193C to the same depth.

FIGS. 1O1 and 1O2 illustrate one arrangement for regions of overlap and no-overlap. In some embodiments, the regions of overlap and non-overlap may be tailored to meet the interconnection requirements of particular device being fabricated. For example, interconnections, and thus, overlap regions, may be different for a memory circuit than an inverter circuit.

FIGS. 1P1 and 1P2 illustrate an alternative embodiment of the product 100 where the mask 171 in FIG. 1H exposes the P-type source/drain material 170 on both sides of the gate structure of the left nano-sheet device 105 such that the P-type source/drain material 170 does not overlap the N-type source/drain material 160 on both source/drain sides. The other steps in the subsequent Figures were performed, resulting in the structure shown in FIGS. 1P1 and 1P2. The source/drain contacts 192A, 192C contact the N-type source/drain material 160 in a first non-overlap region, and the source/drain contacts 192B, 192D contact the P-type source/drain material 170 in a second non-overlap region. In some embodiments, not all of the contacts 192A-192D may be present. The same etch process may be used to form all of the contact openings for the source/drain contacts 192A-192D to the same depth.

FIG. 2 illustrates an alternative embodiment of a process for forming complementary devices. FIG. 2 illustrates the device of FIG. 1H after a plurality of processes was performed to define final or replacement gate electrodes 200 in the gate cavities 175. The simplistically depicted gate electrodes 200 were formed in the gate cavities 175 by depositing the gate electrode material (e.g., gate insulation layer 180, one or more work function material layers 180, 185, and bulk conductive material (e.g., metal)) performing a planarization process to remove excess gate electrode material positioned outside of the gate cavities 175, recessing the gate electrode material, and forming a gate cap layer 205 above the recessed gate material. The devices 105 include an N-type device 199N and a P-type device 199P with a shared gate electrode 197. In FIG. 2, the threshold voltages of the complementary devices 199N, 199P are made consistent with one another based on the different channel materials. The semiconductor material layer 125 may be pure silicon and the semiconductor layer 127 may be silicon germanium.

The techniques described herein allow vertically stacked complementary (e.g., N-type and P-type devices) to be formed. This arrangement significantly reduces the area occupied by the complementary devices.

Figure 3:
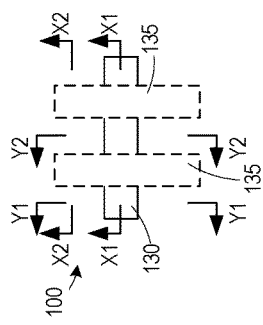
FIG. 3 depicts an alternative embodiment of the product of FIG. 2 with multiple nano-sheets for each source/drain region.
Figure 3:
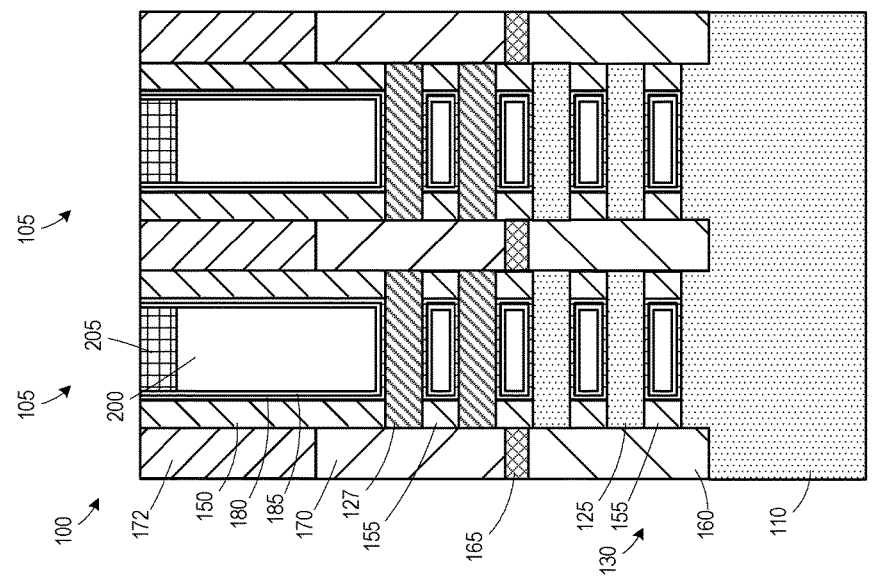

FIG. 3 illustrates an alternative embodiment of the product 100 of FIG. 2, where multiple semiconductor material layers 125 are provided connected to the N-type source/drain material 160, and multiple semiconductor material layers 127 are provided connected to the P-type source/drain material 170. The providing of multiple semiconductor material lines 125, 127 increases the capacity of the devices 105. This arrangement may also be incorporated into the device of FIG. 1L. In some embodiments, more than two layers may be provided, and the number of layers may differ between the N-type and P-type regions.

Figure 4A:
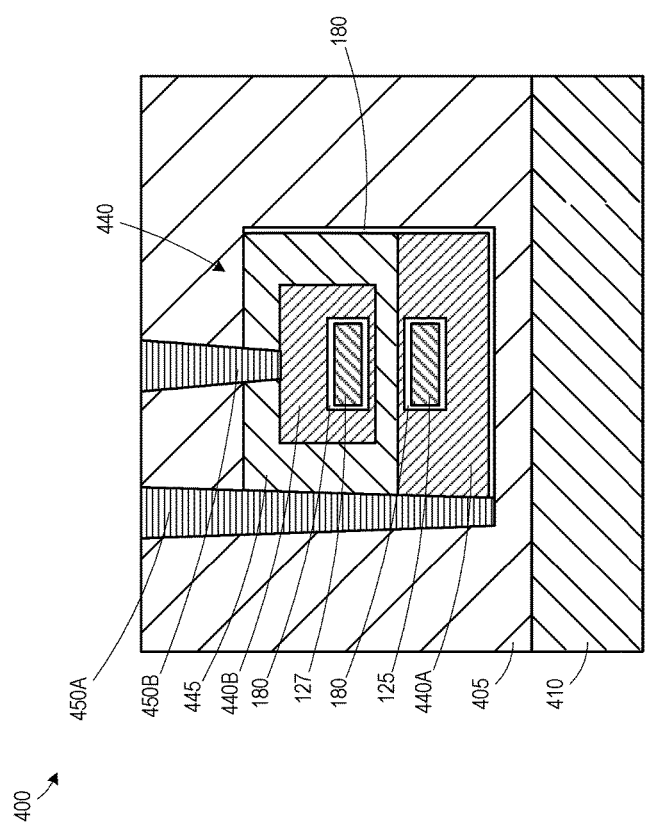
FIGS. 4A and 4B are diagrams of an alternative embodiment of a product having same conductivity type source/drain regions.
Figure 4B:
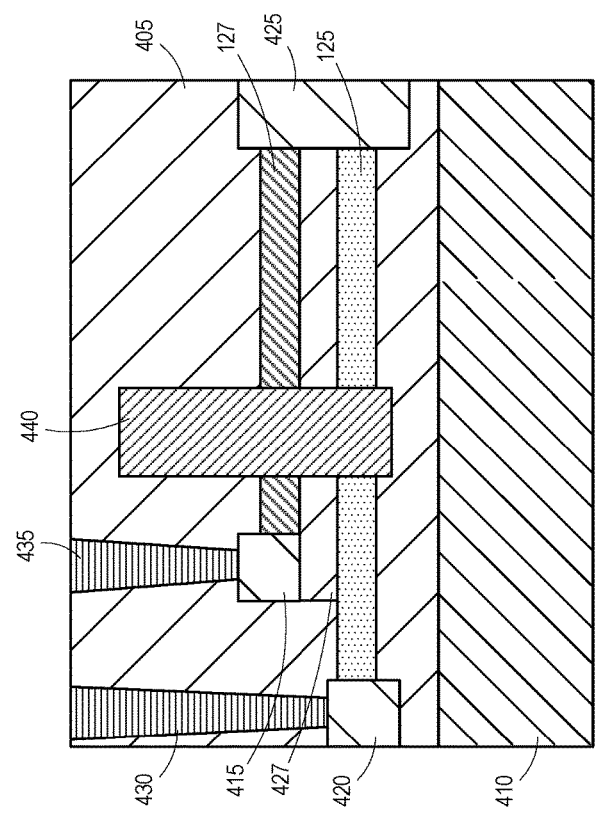

FIGS. 4A and 4B are diagrams of an illustrative embodiment of a product 400 taken through the channel region and along a length of the nano-sheets, respectively. In the embodiment of FIGS. 4A and 4B, the product 400 is a nano-sheet device with the same type of doping for the overlying devices. A dielectric layer 405 is formed above a shallow trench isolation structure 410. The semiconductor layers 125, 127 are supported on the ends by the source/drain regions 415, 420, 425, which may be both P-doped or N-doped, and are separated by a dielectric layer 427. The gate insulation layer 180 was formed in the gate opening. The source/drain regions 415, 420 may be formed as shown above in FIGS. 1A-1P2 and contacts 430, 435 thereto may be similarly formed in non-overlapping regions in the direction along the length of the layers 125, 127 in FIG. 4B.

The source/drain region 425 may represent a merged region (i.e., to form an internal contact between the layers 125, 127). For example, an AND gate may employ two N-type devices, a NAND gate may employ one stacked device with two N-type devices and another stacked device with two P-type devices.

In a device where an internal connection is not required, separate source/drain regions may be provided on both sides of the layers 125, 127 in a non-overlapping fashion (i.e., similar to the source/drain regions 415, 420 on the left side of the device), and additional contacts may be provided for each of the separate source/drain regions.

Rather than the shared gate structure 200 shown in FIGS. 1A-1P2, the device 400 may have a separate gate structure portions. As shown in FIG. 4A, a gate structure 440 (simplified in FIG. 4B) includes a bottom gate electrode 440A capacitively coupled to the semiconductor material layer 125 and a top gate electrode 440B capacitively coupled to the semiconductor material layer 125. A dielectric material 445 separates the gate electrodes 200A, 200B and acts as a cap layer. A contact 450A contacts the bottom gate electrode 440A and a contact 440B contacts the top gate electrode 440B. The positioning of the contact 450B may vary (e.g., may be aligned with the right portion of the top gate electrode 440B.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. Accordingly, the protection sought herein is as set forth in the claims below.

What is claimed:

1. A device comprising:
    a first nano-sheet of a first semiconductor material;
    first source/drain regions positioned adjacent ends of the first nano-sheet;
    a first dielectric material positioned above the first source/drain regions;
    a second nano-sheet of a second semiconductor material positioned above the first nano-sheet;
    second source/drain regions positioned adjacent ends of the second nano-sheet and above the first dielectric material;
    a gate structure having a first portion capacitively coupled to the first nano-sheet and a second portion capacitively coupled to the second nano-sheet; and
    a first source/drain contact contacting a first portion of the second source/drain regions in a first region where the second source/drain regions do not vertically overlap the first source/drain regions, wherein the first source/drain contact has a first depth that extends below a height of an upper surface of the first source/drain regions in a second region where the second source/drain regions vertically overlap the first source/drain regions.

2. The device of claim 1, further comprising a second source/drain contact contacting a first portion of the first source/drain regions and a second portion of the second source/drain regions in the second region.

3. The device of claim 2, further comprising a third source/drain contact contacting a second portion of the first source/drain regions in a third region where the second source/drain regions do not vertically overlap the first source/drain regions.

4. The device of claim 3, wherein the second and third source/drain contacts have the first depth.

5. The device of claim 1, further comprising:
    a second source/drain contact contacting a second portion of the second source/drain regions in the first region on an opposite side of the gate structure compared to the first source/drain contact;
    a third source/drain contact contacting a first portion of the first source/drain regions in a third region where the second source/drain regions do not vertically overlap the first source/drain regions; and
    a fourth source/drain contact contacting a second portion of the first source/drain regions in the third region on an opposite side of the gate structure compared to the third source/drain contact.

6. The device of claim 1, further comprising a second source/drain contact contacting a first portion of the first source/drain regions in a third region where the second source/drain regions do not vertically overlap the first source/drain regions.

7. The device of claim 6, wherein the second source/drain contact has the first depth.

8. The device of claim 1, wherein the first source/drain regions have a first conductivity type, the second source/drain regions have a second conductivity type different than the first conductivity type, the first portion includes a first work function material, and the second portion includes a second work function material different than the first work function material, wherein the first and second work function materials are configured to provide a first threshold voltage associated with the first portion and the first nano-sheet substantially equal to a second threshold voltage associated with the second portion and the second nano-sheet.

9. The device of claim 1, wherein the first source/drain regions have a first conductivity type, the second source/drain regions have a second conductivity type different than the first conductivity type, and the first semiconductor material differs from the second semiconductor material.

10. The device of claim 9, wherein a first germanium concentration of the first semiconductor material differs from a second germanium concentration of the second semiconductor material.

11. A method, comprising:
forming a stack of semiconductor material layers above a substrate, the stack including at least a first nano-sheet of a first semiconductor material and a second nano-sheet of a second semiconductor material;
forming first source/drain regions adjacent ends of the first nano-sheet;
removing a first portion of the first source/drain regions in a first contact region;
forming a first dielectric material above the first source/drain regions and in the first contact region;
forming second source/drain regions adjacent ends of the second nano-sheet and above the first dielectric material, wherein a portion of the second source/drain regions is positioned in the first contact region;
forming a gate structure having a first portion capacitively coupled to the first nano-sheet and a second portion capacitively coupled to the second nano-sheet;
forming a first source/drain contact contacting a second portion of the second source/drain regions in the first contact region, wherein the first source/drain contact has a first depth that extends below an upper surface of the first source/drain regions in a second contact region where the second source/drain regions vertically overlap the first source/drain regions.

12. The method of claim 11, further comprising forming a second source/drain contact contacting a first portion of the first source/drain regions and a third portion of the second source/drain regions in the second contact region.

13. The method of claim 12, further comprising:
removing a fourth portion of the second source/drain regions in a third contact region; and
forming a third source/drain contact contacting a second portion of the first source/drain regions in the third contact region.

14. The method of claim 13, wherein the second and third source/drain contacts have the first depth.

15. The method of claim 11, further comprising:
forming a second source/drain contact contacting a third portion of the second source/drain regions in the first contact region on an opposite side of the gate structure compared to the first source/drain contact;
forming a third source/drain contact contacting a first portion of the first source/drain regions in a third contact region where the second source/drain regions do not vertically overlap the first source/drain regions; and
forming a fourth source/drain contact contacting a second portion of the first source/drain regions in the third contact region on an opposite side of the gate structure compared to the third source/drain contact.

16. The method of claim 11, further comprising:
removing a third portion of the second source/drain regions in a third contact region; and
forming a second source/drain contact contacting a first portion of the first source/drain regions in the third contact region.

17. The method of claim 16, wherein the second source/drain contact has the first depth.

18. The method of claim 11, wherein the first source/drain regions have a first conductivity type, the second source/drain regions have a second conductivity type different than the first conductivity type, and forming the gate structure further comprises forming a first work function material contacting the first nano-sheet and forming a second work function material different than the first work function material contacting the second nano-sheet, wherein the first and second work function materials are configured to provide a first threshold voltage associated with the first portion and the first nano-sheet substantially equal to a second threshold voltage associated with the second portion and the second nano-sheet.

19. The method of claim 11, wherein the first source/drain regions have a first conductivity type, the second source/drain regions have a second conductivity type different than the first conductivity type, and the first semiconductor material differs from the second semiconductor material.

20. The method of claim 19, wherein a first germanium concentration of the first semiconductor material differs from a second germanium concentration of the second semiconductor material.

* * * * *